US 8,820,658 B2

(12) United States Patent
Saddoughi et al.

(10) Patent No.: US 8,820,658 B2
(45) Date of Patent: Sep. 2, 2014

(54) HEAT RESISTANT PIEZO BIMORPH SYNTHETIC JET APPARATUS

(75) Inventors: Seyed G Saddoughi, Clifton Park, NY (US); Grover Bennett, Jr., Schenectady, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 939 days.

(21) Appl. No.: 12/960,952

(22) Filed: Dec. 6, 2010

(65) Prior Publication Data

US 2012/0138704 A1 Jun. 7, 2012

(51) Int. Cl.
*B05B 1/08* (2006.01)
*H01L 41/09* (2006.01)

(52) U.S. Cl.
CPC .................................. *H01L 41/0973* (2013.01)
USPC ....................................................... 239/102.2

(58) Field of Classification Search
CPC ............................ B05B 17/0607; B05B 17/06
USPC .......................................... 239/102.2, 102.1
See application file for complete search history.

(56) References Cited

U.S. PATENT DOCUMENTS

| | | | |
|---|---|---|---|
| 6,722,581 B2 | 4/2004 | Saddoughi | |
| 6,933,662 B2 * | 8/2005 | Arbogast et al. | 310/366 |
| 7,055,329 B2 | 6/2006 | Martens et al. | |
| 7,202,591 B2 * | 4/2007 | Arbogast et al. | 310/332 |
| 7,387,491 B2 | 6/2008 | Saddoughi et al. | |
| 8,006,917 B2 * | 8/2011 | Arik et al. | 239/102.2 |
| 2003/0075615 A1 | 4/2003 | Saddoughi | |
| 2007/0152104 A1 | 7/2007 | Cueman et al. | |
| 2008/0149205 A1 | 6/2008 | Gupta et al. | |
| 2010/0104436 A1 | 4/2010 | Herr et al. | |
| 2011/0174462 A1 * | 7/2011 | Arik et al. | 165/96 |

\* cited by examiner

*Primary Examiner* — Davis Hwu

(74) *Attorney, Agent, or Firm* — Reising Ethington P.C.; John J. Snyder

(57) ABSTRACT

A heat resistant piezo bimorph synthetic jet apparatus comprises a working fluid chamber partially defined by a plate, a working fluid port that provides fluid flow communication between the working fluid chamber and a working fluid mass, and a bimorph piezoelectric structure included in the plate. The bimorph piezoelectric structure alternately increases and decreases chamber volume by alternately expanding convexly and concavely in response to application of voltage of alternating polarity to alternately draw working fluid into and expel working fluid from the working fluid chamber through the working fluid port. A thermal insulating layer is disposed between the working fluid chamber and the bimorph piezoelectric structure to protect a ceramic layer within the first bimorph piezoelectric structure from high temperature working fluid.

19 Claims, 4 Drawing Sheets

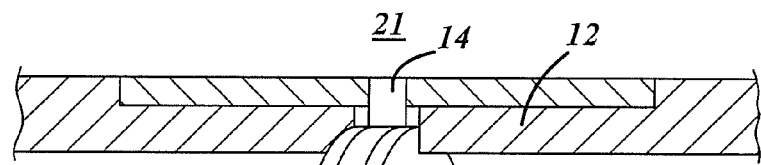
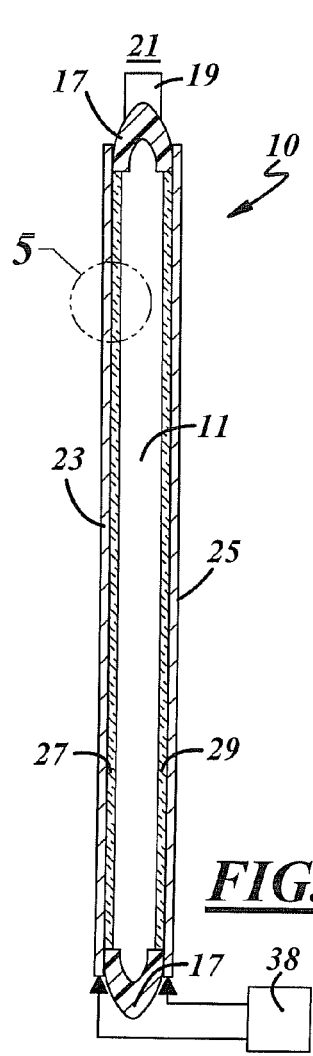
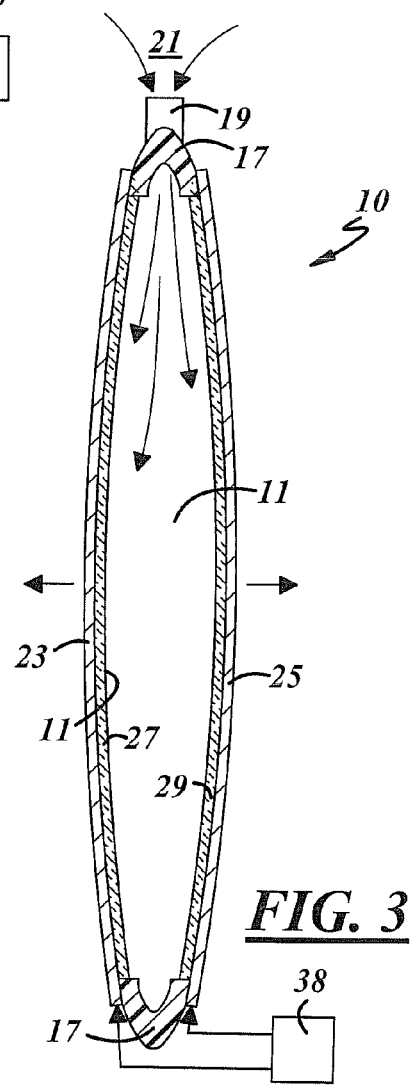

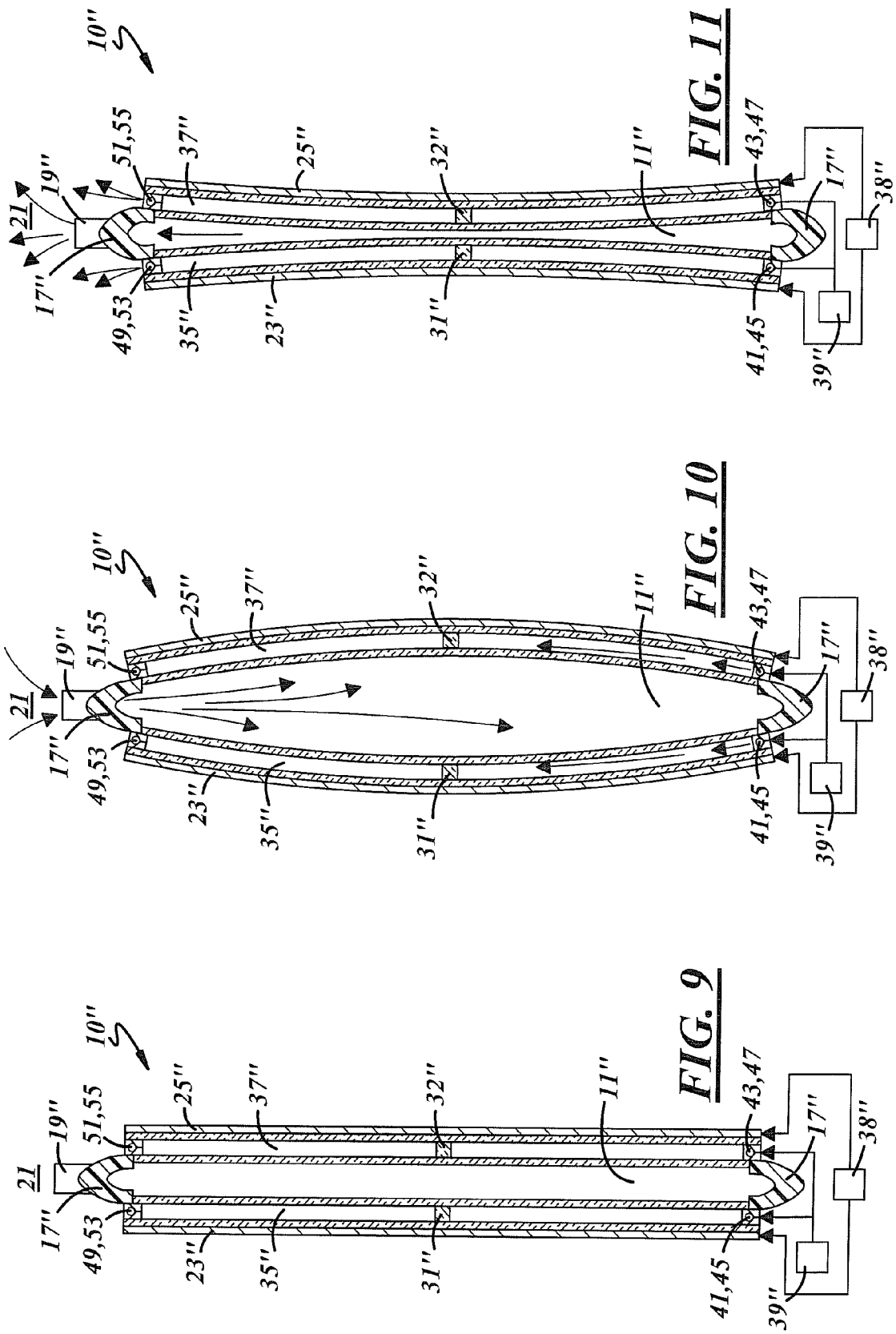

HEAT RESISTANT PIEZO BIMORPH SYNTHETIC JET APPARATUS

CROSS-REFERENCES TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

This invention relates generally to a piezo bimorph synthetic jet apparatus for pulsing a working fluid.

2. Description of the Related Art Including Information Disclosed under 37 CFR 1.97 and 1.98

Dual bimorph synthetic jets (DBSJs) are known apparatus for pulsing jets of fluid into a working fluid mass and are known to comprise a working fluid chamber defined by plates spaced apart by a flexible spacer ring hinge. A working fluid port provides fluid flow communication between the working fluid chamber and an working fluid mass. The plates include respective bimorph piezoelectric structures arranged to alternately expand convexly away from one another and concavely toward one another in response to application of voltage of alternating polarity. Convex expansion of the bimorph piezoelectric structures draws working fluid into the working fluid chamber and concave expansion of the structures expels working fluid from the working fluid chamber through the working fluid port.

BRIEF SUMMARY OF THE DISCLOSURE

A heat resistant piezo bimorph synthetic jet apparatus is provided for pulsing high temperature working fluid. The apparatus may include a working fluid chamber partially defined by a plate and may also include a working fluid port configured to provide fluid flow communication between the working fluid chamber and an ambient/external working fluid mass. A bimorph piezoelectric structure may be included in the plate and configured to alternately increase and decrease chamber volume by alternately expanding convexly and concavely in response to application of voltage of alternating polarity to alternately draw working fluid into and expel working fluid from the working fluid chamber through the working fluid port. A thermal insulating layer may be disposed between the working fluid chamber and the bimorph piezoelectric structure to protect a ceramic layer within the bimorph piezoelectric structure from high temperature fluids such as jet exhaust gases.

The thermal insulating layer may comprise a low thermal conductivity material that may be in the form of a cladding applied to an inner facing surface of the bimorph piezoelectric structure. The low thermal conductivity cladding may comprise silicone, glass, flexible ceramics, and/or polyamides, and may be applied to the inner facing surface of the bimorph piezoelectric structure by an adhesive layer.

The thermal insulating layer may alternatively comprise a cooling fluid chamber disposed between the working fluid chamber and the bimorph piezoelectric structure. The cooling fluid chamber may be configured to be coupled in fluid flow communication with an external source of cooling fluid.

The bimorph piezoelectric structure and cooling fluid chamber may be configured and disposed in respective positions to pump cooling fluid in and out of the cooling fluid chamber as working fluid is being pumped in and out of the working fluid chamber, obviating any need for an additional cooling fluid pumping device.

The cooling fluid chamber may be configured to alternately draw cooling fluid from and return cooling fluid to the external source of cooling fluid.

The apparatus may include a cooling fluid intake check valve disposed in a cooling fluid intake port and configured to provide one-way fluid flow communication into the cooling fluid chamber from the external source of cooling fluid. The apparatus may also include a cooling fluid exhaust check valve disposed in a cooling fluid exhaust port and configured to provide one-way fluid flow communication from the cooling fluid chamber.

The cooling fluid exhaust port may be positioned to direct cooling fluid from the cooling fluid chamber into the ambient/external working fluid mass to enhance cooling effects of the introduction of pulsed flow into hot working fluid. The cooling fluid exhaust port may be disposed adjacent the working fluid port to reinforce and enhance fluid dynamic effects of pulsed working fluid flow from the working fluid chamber.

The working fluid chamber may be further defined by a second plate spaced from the first plate by a flexible spacer ring hinge and a second bimorph piezoelectric structure included in the second plate and configured to alternately expanding convexly and concavely in response to application of voltage of alternating polarity to cooperate with the first bimorph piezoelectric structure in alternately drawing working fluid into and expelling working fluid from the working fluid chamber through the working fluid port. A second thermal insulating layer may be disposed between the working fluid chamber and the second bimorph piezoelectric structure to protect a ceramic layer within the second bimorph piezoelectric structure from high temperature working fluid. The second thermal insulating layer may comprises a low thermal conductivity cladding applied to an inner facing surface of the second bimorph piezoelectric structure or a second cooling fluid chamber disposed between the working fluid chamber and the second bimorph piezoelectric structure, the second cooling fluid chamber being configured to be coupled in fluid flow communication with an external source of cooling fluid. The first and second bimorph piezoelectric structures may each be protected by both a cooling fluid chamber and a low thermal conductivity cladding

BRIEF DESCRIPTION OF THE SEVERAL VIEWS OF THE DRAWINGS

These and other features and advantages will become apparent to those skilled in the art in connection with the following detailed description and drawings of one or more embodiments of the invention, in which:

FIG. 1 is an orthogonal edge view of a synthetic jet constructed according to an embodiment of the invention and shown mounted on one side of a wall and in fluid communication with a working fluid disposed on an opposite side of the wall;

FIG. 2 is a cross-sectional edge view of the synthetic jet of FIG. 1 with first and second bimorph piezoelectric plates of the jet shown in parallel relaxed positions;

FIG. 3 is a cross-sectional edge view of the synthetic jet of FIG. 1 with the first and second bimorph piezoelectric plates of the jet expanded convexly away from one another to draw working fluid into a working fluid chamber of the jet;

FIG. 9 is a cross-sectional edge view of a third synthetic jet embodiment with first and second bimorph piezoelectric plates and cooling chambers of the jet shown in parallel relaxed positions;

FIG. 10 is a cross-sectional edge view of the synthetic jet of FIG. 9 with the first and second bimorph piezoelectric plates and pumping chambers of the jet expanded convexly away from one another to draw working fluid into a working fluid chamber of the jet and cooling fluid into the pumping chambers from a cooling fluid source; and FIG. 11 is a cross-sectional edge view of the synthetic jet of FIG. 9 with the first and second bimorph piezoelectric plates and pumping chambers of the jet expanded concavely toward one another to expel working fluid from the working fluid chamber of the jet into an external working fluid mass and to expel cooling fluid from the cooling chambers into the external working fluid mass.

DETAILED DESCRIPTION OF INVENTION EMBODIMENT(S)

Figure 4:
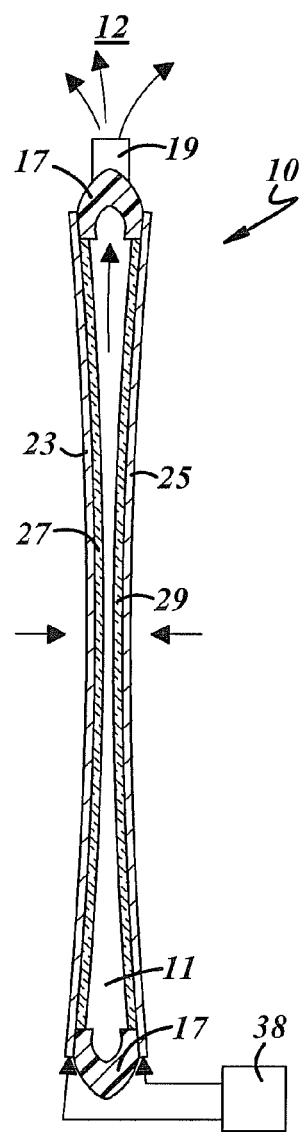
FIG. 4 is a cross-sectional edge view of the synthetic jet of FIG. 1 with the first and second bimorph piezoelectric plates of the jet expanded concavely toward one another to expel working fluid from the working fluid chamber of the jet.

A heat resistant dual bimorph synthetic jet apparatus for pulsing high temperature working fluid is generally shown at 10 in FIGS. 1-5. Second and third embodiments are generally shown at 10' and 10" in FIGS. 6-8 and 9-11, respectively. Reference numerals with the designation prime (') in FIGS. 6-8 and the designation double-prime (") in FIGS. 9-11 indicate alternative configurations of elements that also appear in the first embodiment. Unless indicated otherwise, where a portion of the following description uses a reference numeral to refer to FIGS. 1-5, that portion of the description applies equally to elements designated by primed numerals in FIGS. 6-8 and double-primed numerals in FIGS. 9-11. Likewise, where a portion of the following description uses a reference numeral to refer to FIGS. 6-8, that portion of the description applies equally to elements designated by double-primed numerals in FIGS. 9-11.

As shown in FIGS. 2-4, the apparatus 10 may include a working fluid chamber 11 defined by first and second plates 23, 25 that may be spaced apart by a flexible peripheral spacer ring hinge 17. The apparatus 10 may further include a working fluid port 19 that provides fluid flow communication between the working fluid chamber 11 and a working fluid mass 21. The working fluid mass 21 may be external with respect to the working fluid chamber 11. For example, the working fluid mass 21 may include ambient gasses and/or liquids that may be static or moving relative to the apparatus 10. As shown in FIG. 1, the apparatus 10 may be supported on and separated from the working fluid mass 21 by a wall 12 through which the working fluid port 19 may extend to provide fluid communication between the fluid mass 21 and the working fluid chamber 11.

Figure 5:
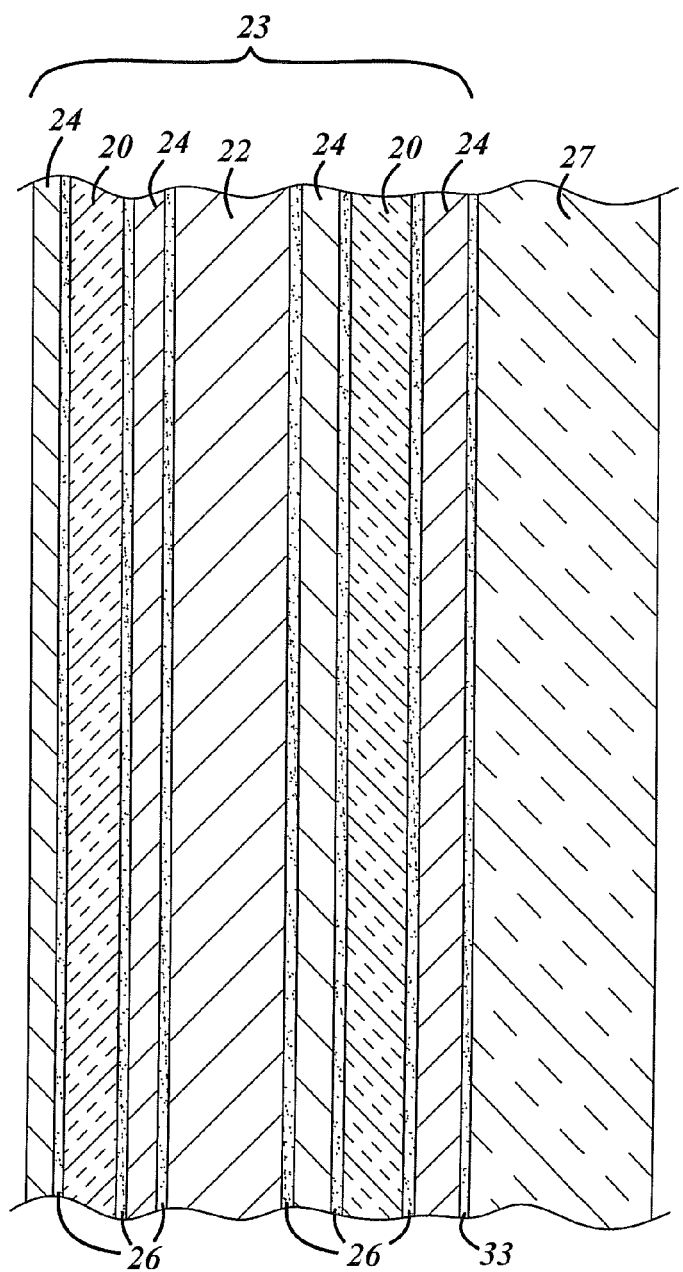
FIG. 5 is an enlarged view of the region circumscribed by circle 5 in FIG. 2.

As shown in FIG. 5 the first and second plates 23, 25 may comprise first and second bimorph piezoelectric structures, respectively, which may each include two piezoelectric layers 20 comprising piezoceramic material. The two bimorph structures may be separated by a shim layer 22 comprising a material such as aluminum. Metallic cladding layers 24 may be attached to either side of each piezoelectric layer 20 by respective adhesive layers 26. The two cladded piezoelectric layers 20 may be attached to either side of the shim layer 22 by further adhesive layers 26. Additional details of the construction and operation of the piezoelectric plate structures 23, 25 may be as disclosed in U.S. Pat. Nos. 6,722,581, 7,055,329; and U.S. Patent Publication Serial No. 20030075615, all of which are assigned to General Electric Company and are incorporated by reference herein in their entireties.

The plates 23, 25 may be configured to alternately increase and decrease working fluid chamber volume by alternately expanding convexly (away from one another) and concavely (toward one another) in response to the application of voltage of alternating polarity to each of the plates 23, 25 from a controllable electric power source 38. This alternating increase and decrease in working fluid chamber volume alternately draws working fluid into and expels working fluid from the working fluid chamber 11 through the working fluid port 19.

As shown in FIGS. 2-5, the apparatus 10 may also include first and second thermal insulating layers 27, 29 disposed between the working fluid chamber 11 and the respective first and second bimorph piezoelectric structures 23, 25 to protect the piezoceramic layers 20 within the bimorph piezoelectric structures from high temperature fluids such as jet exhaust gases. The first and second thermal insulating layers 27, 29 may comprise a low thermal conductivity material, which may be in the form of a low thermal conductivity cladding 27, 29 applied to inner facing surfaces of the first and second bimorph piezoelectric structures 23, 25. The low thermal conductivity cladding 27, 29 may comprise any suitable material such as, for example, silicone, glass, flexible ceramics, and/or polyamides. As is representatively shown in FIG. 5 with respect to the first piezoelectric structure 23, the cladding 27, 29 may be applied to the inner facing surfaces of the first and second bimorph piezoelectric structures 23, 25 by an adhesive layer 33 comprising any suitable adhesive material such as, for example, silicone adhesive material, high temperature epoxies, solders, and/or braze metals.

Figure 8:
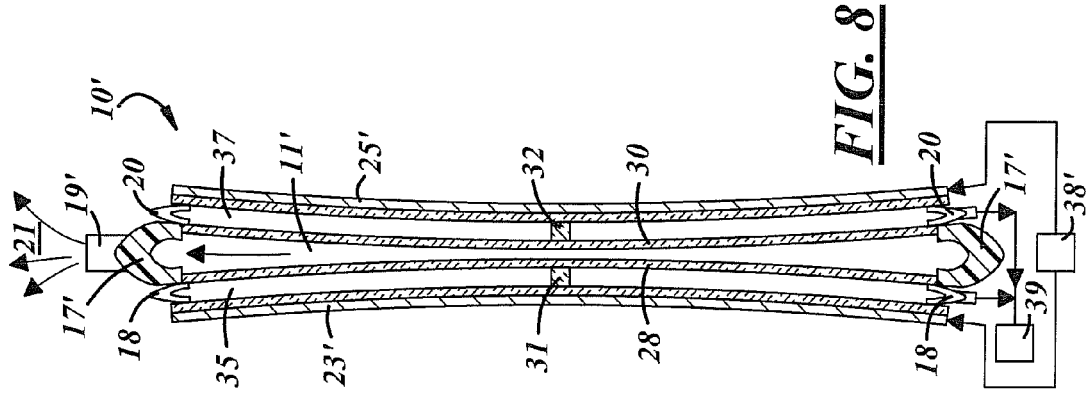
FIG. 8 is a cross-sectional edge view of the synthetic jet of FIG. 6 with the first and second bimorph piezoelectric plates and pumping chambers of the jet expanded concavely toward one another to expel working fluid from the working fluid chamber of the jet and to expel cooling fluid from the cooling chambers back to the cooling fluid source.
Figure 7:
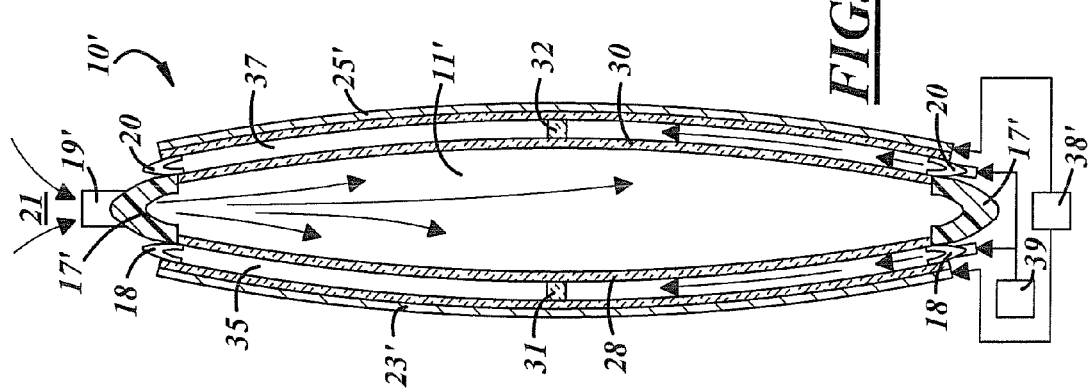
FIG. 7 is a cross-sectional edge view of the synthetic jet of FIG. 6 with the first and second bimorph piezoelectric plates and pumping chambers of the jet expanded convexly away from one another to draw working fluid into a working fluid chamber of the jet and cooling fluid into the pumping chambers from a cooling fluid source.
Figure 6:
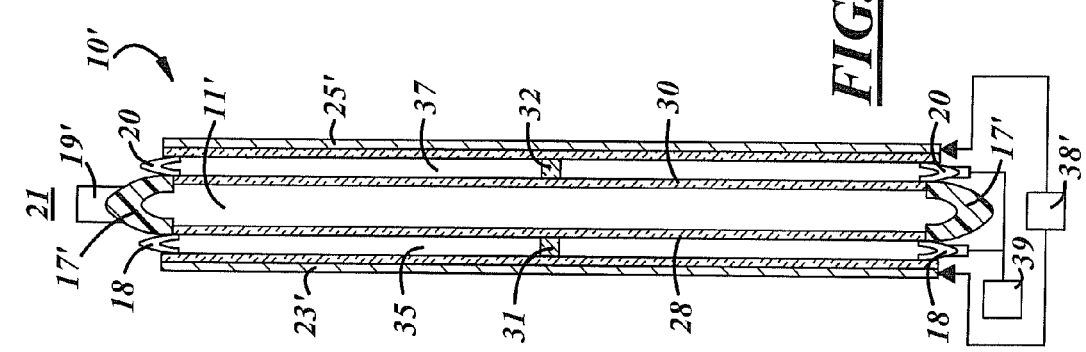
FIG. 6 is a cross-sectional edge view of a second synthetic jet embodiment with first and second bimorph piezoelectric plates and cooling chambers of the jet shown in parallel relaxed positions.

According to the second embodiment, and as shown in FIGS. 6-8, the apparatus 10' may include first and second cooling fluid chambers 35, 37 defined by the respective first and second bimorph piezoelectric structures 23', 25', and first and second inner dividing plates 28, 30 that separate the working fluid chamber 11' from the cooling fluid chambers 35, 37. The first and second bimorph piezoelectric structures 23', 25' and the respective first and second inner dividing plates 28, 30 may be spaced apart by respective first and second flexible peripheral spacer ring hinges 18, 20. The first and second inner dividing plates 28, 30 may be connected to the respective first and second bimorph piezoelectric structures 23', 25' such that the first and second inner dividing plates 28, 30 are alternately drawn outward and pushed inward along with their respective associated first and second bimorph piezoelectric structures 23', 25'. The connections between the dividing plates 28, 30 and their associated respective bimorph piezoelectric structures 23', 25' may include respective pillars 31, 32 that may be adhesively bonded at respective opposite ends to the respective dividing plates 28, 30 and bimorph piezoelectric structures 23', 25'. The pillars 31, 32 may be made of any suitable material, and preferably a low conductivity material such as, for example, a ceramic material.

The first and second cooling fluid chambers 35, 37 may be coupled in fluid flow communication with an external source 39' of cooling fluid, which may be disposed outside of the dual bimorph synthetic jet apparatus 10'. As shown in FIGS. 7 and 8, the bimorph piezoelectric structures 13' 15' and cooling fluid chambers 35, 37 may be configured and disposed in respective positions to pump cooling fluid in and out of the cooling fluid chambers 35, 37 as working fluid is being pumped in and out of the working fluid chamber 11'. This obviates any need for an additional cooling fluid pumping device. The cooling fluid chambers 35, 37 may be configured to alternately draw cooling fluid from and return cooling fluid to the external source 39 of cooling fluid.

According to the third embodiment, and as shown in FIGS. 9-11, the apparatus 10" may include first and second cooling fluid intake check valves 41, 43 disposed respectively in first and second cooling fluid intake ports 45, 47 and configured to provide one-way fluid flow communication into the first and second cooling fluid chambers 35", 37" from at least one external source of cooling fluid 39". The apparatus may further include first and second cooling fluid exhaust check valves 49, 51 disposed in respective first and second cooling fluid exhaust ports 53, 55 and configured to provide one-way fluid flow communication from the first and second cooling fluid chambers 35", 37".

The first and second cooling fluid exhaust ports 53, 55 may be positioned to direct cooling fluid from the first and second cooling fluid chambers 35", 37" into the ambient/external working fluid mass 21" to enhance the cooling effects of the introduction of pulsed flow into hot working fluid. The first and second cooling fluid exhaust ports 53, 55 may also be disposed adjacent the working fluid port to reinforce and enhance the fluid dynamic effects of pulsed working fluid flow from the working fluid chamber 11".

As shown in FIGS. 8-10, the first and second bimorph piezoelectric structures 23", 25" may each be protected by both a cooling fluid chamber 35" 37" and a low thermal conductivity cladding 27, 29.

The addition of heat-resistant cladding, and/or cooling fluid chambers allows dual bimorph synthetic jets to be used in environments, such as jet engine exhaust nozzles, which expose the synthetic jets to high temperature working fluids that would otherwise damage ceramic elements of the bimorph piezoelectric structures of the synthetic jets.

This description, rather than describing limitations of an invention, only illustrates embodiments of the invention recited in the claims. The language of this description is therefore exclusively descriptive and is non-limiting. Obviously, it's possible to modify this invention from what the description teaches. Within the scope of the claims, one may practice the invention other than as described above.

What is claimed is:

1. A heat resistant piezo bimorph synthetic jet apparatus for pulsing high temperature working fluid, the apparatus comprising:
   a working fluid chamber partially defined by a first plate;
   a working fluid port configured to provide fluid flow communication between the working fluid chamber and a working fluid mass;
   a first bimorph piezoelectric structure included in the first plate and configured to alternately increase and decrease chamber volume by alternately expanding convexly and concavely in response to application of voltage of alternating polarity to alternately draw working fluid into and expel working fluid from the working fluid chamber through the working fluid port; and
   a thermal insulating layer disposed between the working fluid chamber and the first bimorph piezoelectric structure to protect a ceramic layer within the first bimorph piezoelectric structure from high temperature working fluid.

2. A heat resistant piezo bimorph synthetic jet apparatus as defined in claim 1 in which the thermal insulating layer comprises a low thermal conductivity material.

3. A heat resistant piezo bimorph synthetic jet apparatus as defined in claim 2 in which the thermal insulating layer comprises a low thermal conductivity cladding applied to an inner facing surface of the first bimorph piezoelectric structure.

4. A heat resistant piezo bimorph synthetic jet apparatus as defined in claim 3 in which the low thermal conductivity cladding comprises one or more materials selected from the group of materials consisting of silicone, glass, flexible ceramics, and polyamides.

5. A heat resistant piezo bimorph synthetic jet apparatus as defined in claim 3 in which the cladding is applied to the inner facing surface of the first bimorph piezoelectric structure by an adhesive layer.

6. A heat resistant piezo bimorph synthetic jet apparatus as defined in claim 1 in which the thermal insulating layer comprises a cooling fluid chamber disposed between the working fluid chamber and the first bimorph piezoelectric structure, the cooling fluid chamber being configured to be coupled in fluid flow communication with an external source of cooling fluid.

7. A heat resistant piezo bimorph synthetic jet apparatus as defined in claim 6 in which the first bimorph piezoelectric structure and cooling fluid chamber are configured and disposed in respective positions to pump cooling fluid in and out of the cooling fluid chamber as working fluid is being pumped in and out of the working fluid chamber.

8. A heat resistant piezo bimorph synthetic jet apparatus as defined in claim 6 in which the cooling fluid chamber is configured to alternately draw cooling fluid from and return cooling fluid to the external source of cooling fluid.

9. A heat resistant piezo bimorph synthetic jet apparatus as defined in claim 6 in which the apparatus includes:
   a cooling fluid intake check valve disposed in a cooling fluid intake port and configured to provide one-way fluid flow communication into the cooling fluid chamber from the external source of cooling fluid; and
   a cooling fluid exhaust check valve disposed in a cooling fluid exhaust port and configured to provide one-way fluid flow communication from the cooling fluid chamber.

10. A heat resistant piezo bimorph synthetic jet apparatus as defined in claim 9 in which the cooling fluid exhaust port is positioned to direct cooling fluid from the cooling fluid chamber into the working fluid mass.

11. A heat resistant piezo bimorph synthetic jet apparatus as defined in claim 10 in which the cooling fluid exhaust port is disposed adjacent the working fluid port.

12. A heat resistant piezo bimorph synthetic jet apparatus as defined in claim 6 in which the apparatus includes a second thermal insulating layer disposed between the working fluid chamber and the first bimorph piezoelectric structure.

13. A heat resistant piezo bimorph synthetic jet apparatus as defined in claim 12 in which the second thermal insulating layer comprises a low thermal conductivity material.

14. A heat resistant piezo bimorph synthetic jet apparatus as defined in claim 12 in which the second thermal insulating layer comprises a low thermal conductivity cladding applied to an inner facing surface of the first bimorph piezoelectric structure.

15. A heat resistant piezo bimorph synthetic jet apparatus as defined in claim 14 in which the low thermal conductivity cladding comprises one or more materials selected from the group of materials consisting of silicone, glass, flexible ceramics, and polyamides.

16. A heat resistant piezo bimorph synthetic jet apparatus as defined in claim 14 in which the cladding is applied to the inner facing surface of the first bimorph piezoelectric structure by an adhesive layer.

17. A heat resistant piezo bimorph synthetic jet apparatus as defined in claim 1 in which:
 the working fluid chamber is further defined by a second plate spaced from the first plate by a flexible spacer ring hinge;
 a second bimorph piezoelectric structure is included in the second plate and configured to alternately expanding convexly and concavely in response to application of voltage of alternating polarity to cooperate with the first bimorph piezoelectric structure in alternately drawing working fluid into and expelling working fluid from the working fluid chamber through the working fluid port; and
 a second thermal insulating layer disposed between the working fluid chamber and the second bimorph piezoelectric structure to protect a ceramic layer within the second bimorph piezoelectric structure from high temperature working fluid.

18. A heat resistant piezo bimorph synthetic jet apparatus as defined in claim 17 in which the second thermal insulating layer comprises a low thermal conductivity cladding applied to an inner facing surface of the second bimorph piezoelectric structure.

19. A heat resistant piezo bimorph synthetic jet apparatus as defined in claim 17 in which the second thermal insulating layer comprises a second cooling fluid chamber disposed between the working fluid chamber and the second bimorph piezoelectric structure, the second cooling fluid chamber being configured to be coupled in fluid flow communication with an external source of cooling fluid.

\* \* \* \* \*